(12) United States Patent
Lin

(10) Patent No.: US 6,215,578 B1
(45) Date of Patent: Apr. 10, 2001

(54) ELECTRONICALLY SWITCHABLE OFF-AXIS ILLUMINATION BLADE FOR STEPPER ILLUMINATION SYSTEM

(75) Inventor: Chin-Hsiang Lin, Kaohsung (TW)

(73) Assignee: Vanguard International Semiconductor Corporation, Hsin-Chu (TW)

(*) Notice: Subject to any disclaimer, the term of this patent is extended or adjusted under 35 U.S.C. 154(b) by 0 days.

(21) Appl. No.: 09/156,056

(22) Filed: Sep. 17, 1998

(51) Int. Cl.⁷ .................................................. G02B 26/00
(52) U.S. Cl. ............................ 359/292; 355/53; 359/562
(58) Field of Search .................................. 355/53, 67, 71; 359/558, 559, 561–563, 285–287, 292, 310, 305, 306; 362/231; 378/145–153; 382/42, 210, 211

(56) References Cited

U.S. PATENT DOCUMENTS

| | | | |
|---|---|---|---|
| 3,824,604 | 7/1974 | Stein | 354/5 |
| 4,796,038 * | 1/1989 | Allen | 354/4 |
| 4,846,694 | 7/1989 | Erhardt | 434/365 |
| 5,028,939 | 7/1991 | Hornbeck | 346/160 |
| 5,083,854 | 1/1992 | Zampolin et al. | 359/40 |
| 5,161,176 * | 11/1992 | Ebinuma et al. | 378/34 |
| 5,194,893 * | 3/1993 | Nishi | 355/53 |
| 5,264,898 * | 11/1993 | Kamon et al. | 355/67 |
| 5,453,814 | 9/1995 | Aiyer | 355/70 |
| 5,576,562 | 11/1996 | Komura | 257/232 |
| 5,600,485 | 2/1997 | Iwaki et al. | 359/561 |
| 5,638,211 | 6/1997 | Shiraishi | 359/559 |
| 5,675,402 * | 10/1997 | Cho et al. | 355/71 |
| 5,684,567 | 11/1997 | Shiozawa | 355/67 |
| 5,691,541 * | 11/1997 | Ceglio et al. | 250/492.1 |
| 5,712,698 | 1/1998 | Poschenrieder et al. | 355/71 |
| 5,815,247 * | 9/1998 | Poschenrieder et al. | 355/71 |
| 5,870,176 * | 2/1999 | Sweatt et al. | 355/53 |
| 5,900,637 * | 5/1999 | Smith | 250/492.22 |

OTHER PUBLICATIONS

Allen, P. C. "Laser Pattern Generation below 0.25 Micrometers", in Optical Microlithography Xi, Luc Van den hove, Editor, Proceedings of S.P.I.E. vol. 3334, pp. 460–468, Feb. 1998.*

Pfauler et al, "High–Throughput Optical Direct Write Lithography" Solid State Technology (Jun. 1997) pp. 175, 176,178,180,182.

* cited by examiner

Primary Examiner—Georgia Epps
Assistant Examiner—David N. Spector
(74) Attorney, Agent, or Firm—George O. Saile; Stephen B. Ackerman; Graham S. Jones, II

(57) ABSTRACT

An off axis illumination stepper exposure system includes an illumination system with an aperture element and lenses. The aperture element comprises an array of electronically switchable pixels in a matrix. The aperture element can be a transmissive spatial light modulator. An annular pattern of transmissivity through an aperture element is provided by a spatial light modulator operated under computer control. The computer can select and provide variable dimensions of the pattern to optimize operation of the device. In addition to a first transmissive spatial light modulator providing an aperture in the illumination system with a pattern of transmissivity operated under computer control, a mask is provided in the form of a second transmissive spatial light modulator operated under computer control operating cooperatively to provide images projected through a projection system onto a workpiece supported upon a stepper tool.

13 Claims, 6 Drawing Sheets

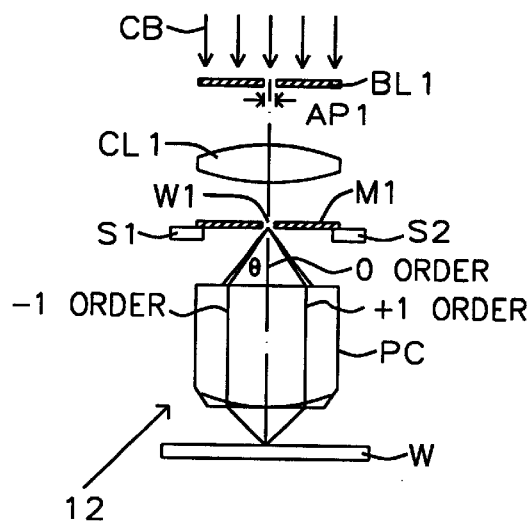
FIG. 1 – Prior Art
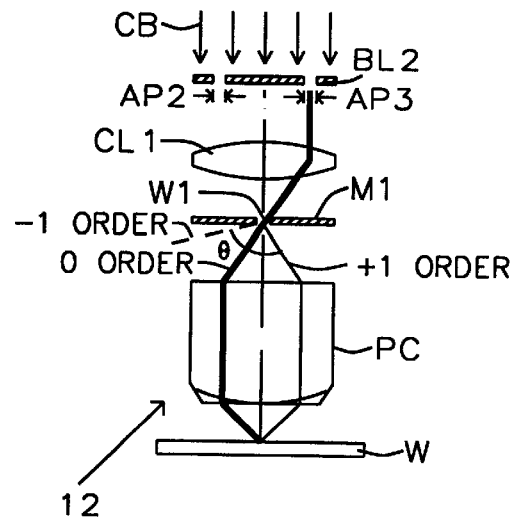
FIG. 2 – Prior Art
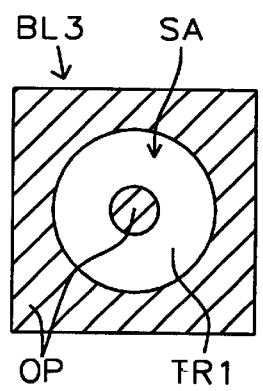
FIG. 3A – Prior Art
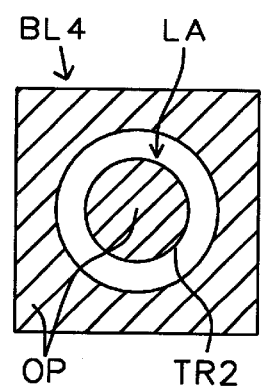
FIG. 3B – Prior Art

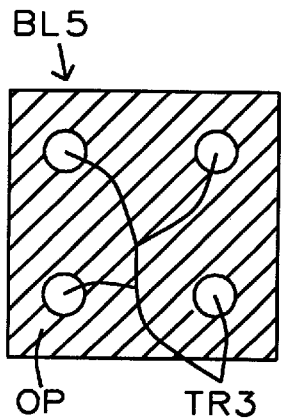
FIG. 3C – Prior Art
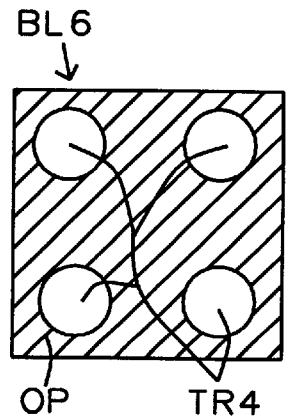
FIG. 3D – Prior Art
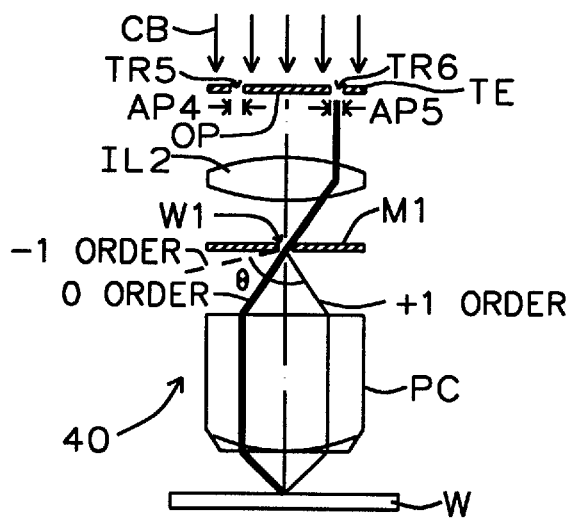
FIG. 4

ELECTRONICALLY SWITCHABLE OFF-AXIS ILLUMINATION BLADE FOR STEPPER ILLUMINATION SYSTEM

BACKGROUND OF THE INVENTION

1. Field of the Invention

This invention relates to optical exposure and more particularly to Off-Axis Illumination (OAI) methods and apparatus for optical exposure tools.

2. Description of Related Art

U.S. Pat. No. 5,712,698 of Poschenrieder et al. for "Independently Controllable Shutters and Variable Area Apertures for Off Axis Illumination" describes use of an aperture plate including apertures that provide off axis illumination located between an exposure source and a photomask provided with variable area apertures by use of independently controllable mechanical shutters.

U.S. Pat. No. 5,453,814 of Aiyer for "Illumination Source and Method for Microlithographyl" shows an exposure system that using uses acousto-optical modulators, i.e. Bragg cells to change the frequency of light. The system separates a light source into a number of segments. Each segment is frequency shifted by a different amount. Each segment of light passes through a short focal length lens of a fly's eye array to be dispersed onto a mask plane for evenly illuminating a mask. The fly's eye array is comprised of Bragg cell units (of Acousto-optical modulators) that comprise a transparent crystal to which a radio frequency voltage is applied. The Bragg cells shift the frequency of the light passing therethrough.

U.S. Pat. No. 5,638,211 of Shiraishi for "Method and Apparatus for Increasing the Resolution Power of Projection Lithography Exposure System" discloses an illumination system for illuminating a mask. A condenser lens and an optical integrator element are followed by a spatial filters with windows arranged at the Fourier transform plane. Another spatial filter is located at the at the Fourier transform plane of the projection optical system. The spatial filters are formed by a light shielding plate or an electrooptic element such as a liquid crystal device or an electro chromic device.

U.S. Pat. No. 5,684,567 of Shiozawa for "Exposure Apparatus and Device Manufacturing Method for Projecting Light from a Secondary Light Source onto a Mask or Pattern" shows an exposure system having a series of optical integrators for shifting the frequency of light and also shows a CCD for monitoring the light quality.

U.S. Pat. No. 5,600,485 of Iwaki et al. for "Optical Pattern Recognition System Method of Ferroelectric Liquid Crystal Spatial Light Modulator" discusses SLM (Spatial Light Modulators) systems including a transmissive spatial light modulator 104 in FIG. 2 described at Col. 18, lines 34–51.

U.S. Pat. No. 5,701,185 of Reiss et al. for "Spatial Light Modulator Assembly for Adapting a Photographic Printer to Print Electronic Images" shows use of a SLM for an electronic printing process.

Pfauler et al. "High-Throughput Optical Direct Write Lithography", Solid State Technology (June 1997), pp. 175–176, 178, 180, 182 describes a direct write lithography system using a programmable phase-modulated SLM system in which the image is reflected from the SLM onto a semiconductor wafer. The spatial light modulator comprises an array of rectangular electrodes with a reflective, deformable viscoelastic layer on top. The SLM serves as a plane mirror in an optical system.

U.S. Pat. No. 4,846,694 of Erhardt for "Computer Controlled Overhead Projector Display" in which a computer controls a transmissive (transparent or semi-transparent) liquid crystal display overhead projector display.

U.S. Pat. No. 3,824,604 of Stein for "Alphanumeric Printing System Employing Liquid Crystal Matrix" shows a printing system using a LCD matrix.

U.S. Pat. No. 5,028,939 of Hornbeck for "Spatial Light Modulator System" shows a SLM.

U.S. Pat. No. 5,083,854 of Zampolin et al. for "Spatial Light Modulator with Improved Aperture Ratio" shows a SLM with improved aperture ratio.

U.S. Pat. No. 5,576,562 of Komuma for "Solid-State Imaging Device" shows an imaging device using photodetectors arranged in a matrix array and a CCD.

FIG. 1 shows a conventional prior art illumination system 12 wherein the Critical Dimension (CD) is close to the exposure wavelength, which reduces the image quality. A collimated beam CB of light is directed at a blade BL1 which contains an aperture AP through which a patterned beam passes down through condenser lens CL1 through mask M1 with window W1 therein and then the beam passes down through projection system PC onto the target workpiece which is a semiconductor wafer W. There is a dispersion of the beam from the −1 order beam to the 0 order beam to the +1 order beam with an angle of Θ between the −1 order beam and the +1 order beam. If the mask M1 has a line/space pitch of P, then for wavelength LAMBDA there are relationships defined by the equations as follows:

$$\sin\Theta = \frac{LAMBDA}{P}$$

$$\text{Resolution limit, } NA = \sin\Theta = \frac{LAMBDA}{P}; P = \frac{LAMBDA}{NA}$$

$$\text{line} = \frac{1}{2}P$$

$$\text{Resolution limit} = \frac{1}{2} \cdot \frac{LAMBDA}{NA}$$

FIG. 2 shows a prior art Off Axis Illumination (OAI) system 14 which is a modification of FIG. 1 in that the simple aperture blade BL1 has been replaced with an OAI blade BL2 which employs a conventional OAI mechanical blade. In FIG. 2, a collimated light beam CB is directed at a new OAI blade BL2 which contains at least apertures AP2 and AP3 through which a patterned portion of beam CB passes down through condenser lens CL1 through mask M1 with window W1 therein and then the beam passes down through projection system PC. There is a dispersion of the beam from the −1 order beam to the 0 order beam to the +1 order beam with an angle of Θ between the −1 order beam and the +1 order beam, but the −1 order beam is shown being directed away from the semiconductor wafer W.

$$\frac{LAMBDA}{P} = 2NA$$

$$P = \frac{1}{2} \cdot \frac{LAMBDA}{NA}$$

$$2 \cdot \text{Resolution limit} = \frac{LAMBDA}{2NA}$$

$$\text{Resolution limit} = \frac{1}{4} \cdot \frac{LAMBDA}{NA}$$

Therefore, the OAI is has improved resolution. Due to the incident angles the zero order and first order (+1) diffracted beams at the wafer W are equal. Therefore the optical paths are the same. The result is that there is no wavefront aberrations, so the Depth Of Focus (DOF) is improved significantly.

In the case of a conventional mechanical OAI blade, there is the problem that the mechanism creates instability and positioning errors for every insertion.

Another problem with a mechanical blade with the OAI arrangement of FIG. 2 is that it can include a limited number of patterns for the OAI blade and this makes it difficult to provide different OAI patterns for use. This is manifested by the use of rotatable shutters in Poschenrieder et al. U.S. Pat. No. 5,453,814, cited above.

FIGS. 3A–3D shows four different patterns of a conventional OAI blade which are mechanically inserted into an OAI aperture position.

In FIG. 3A, a blade is shown with a pattern SA (Small Annular) transmissive region TR1 and inner and outer opaque regions OP. Light passes through transmissive region TR0 but, on the contrary, light is absorbed or blocked by opaque regions OP.

In FIG. 3B, another blade is shown with a large annular LA pattern with a transmissive region TR2 and inner and outer opaque regions OP.

In FIG. 3C, a third blade is shown with quadrupoles with a set of transmissive regions TR3 and overall opaque region OP.

In FIG. 3D, a fourth blade is shown with quadrupoles with a larger set of transmissive regions TR4 and overall opaque region OP.

SUMMARY OF THE INVENTION

The invention provides electronic switching of a image forming matrix, such as an SLM, to form a blade in an OAI stepper exposure tool.

An off axis illumination system for a stepper exposure tool includes an aperture element, a lens, and a mask wherein the aperture element comprises an array of electronically switchable pixels in a matrix. The aperture element can be a transmissive spatial light modulator. An annular pattern of transmissivity through an aperture element is provided by a spatial light modulator operated under computer control. The computer can select and provide variable dimensions of the pattern to optimize operation of the device. In addition to a first transmissive spatial light modulator providing an aperture in the illumination system with a pattern of transmissivity operated under computer control, a mask is provided in the form of a second transmissive spatial light modulator operated under computer control operating cooperatively to provide images projected through a projection system onto a workpiece supported upon a stepper tool.

BRIEF DESCRIPTION OF THE DRAWINGS

The foregoing and other aspects and advantages of this invention are explained and described below with reference to the accompanying drawings, in which:

FIG. 1 shows a conventional prior art illumination system wherein the Critical Dimension is close to the exposure wavelength, which reduces the image quality.

FIG. 2 shows a prior art OAI system which is a modification of FIG. 1 in that a simple aperture blade has been replaced with an OAI blade which employs a conventional OAI mechanical blade.

FIGS. 3A–3D shows four different prior art patterns of a conventional OAI blade which are mechanically inserted into an OAI aperture position.

FIG. 4 shows an electronically switchable off-axis illumination blade in accordance with this invention adapted for use in a stepper illumination system.

DESCRIPTION OF THE PREFERRED EMBODIMENT

Figure 5B:
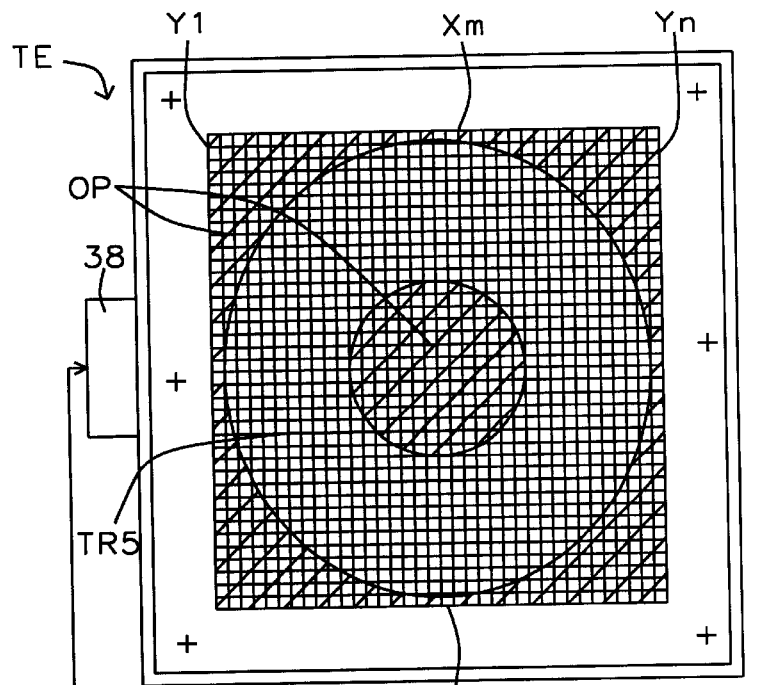
FIG. 5B shows a key for the shading of the pattern of ON and OFF pixels in the transmissive aperture element which shows a large aperture pattern with transmissive regions and opaque pixel regions.

FIG. 4 shows an electronically switchable off-axis illumination blade in accordance with this invention adapted for use in a stepper illumination system. FIG. 4 includes an illumination system substitution for an OAI blade a transmission element TE which employs a dynamic x, y coordinate system switching matrix which selectively provides both transmissive and opaque picture elements (pixels) in an optical pattern controlled by a computer, such as computer 26 in FIG. 7A or other electronic control device, in accordance with this invention.

In the case of a conventional mechanical OAI blade, there is the problem that the mechanism creates instability and positioning errors for every insertion. In accordance with this invention with the electronically controlled transmissive aperture element TE, a collimated beam CB of light is directed at a device providing an optical image of an OAI blade formed on transmissive element TE which is shown after it has been temporarily patterned to present images such as images of apertures AP4 and AP5 seen in FIG. 4 through which a patterned beam passes down through condenser lens IL2 through patterning mask M1 with window W1 therein and then the beam passes down through projection system PC as in FIG. 2.

The OAI transmissive aperture element TE of FIG. 4 has the improved resolution of the mechanical mask of FIG. 2 as again the incident angles the zero order and first order (+1) diffracted beams at the wafer W are equal. Therefore the optical paths are the same. The result is that there are no wavefront aberrations, so the Depth Of Focus (DOF) is improved significantly.

In accordance with this invention, referring to FIGS. 3A–3D, for a different layer, an appropriate OAI pattern is selected by the computer 26 in FIGS. 7A to be presented upon the aperture element TE', as explained below, to fit in the aperture position.

FIG. 4 shows an illumination and projection system in accordance with this invention which is a modification of the system 14 of FIG. 2. The system 40 includes a universal dynamic transmissive off axis aperture element TE serving as an OAI blade for use in the system of FIG. 4. The system 40 exposes a workpiece W with a pattern of light projected from beam CB through transmissive off axis aperture element TE, lens IL2, a mask M1 and projection system PC in accordance with this invention. The transmissive off axis aperture element TE is supported in a fixed position in the illumination system of FIG. 4. Transmissive off axis aperture element element TE is energized by applying actuation signals to lines to the x, y matrices as illustrated by FIG. 5A which includes a plan view of the transmissive off axis aperture element element TE and the control system including computer 26 which energizes the pixel elements of the transmissive off axis aperture element element TE. Thus workpiece W is exposed to a pattern provided by transmissive off axis aperture element element TE under control of computer 26.

FIG. 5A is a schematic drawing showing plan views of both of the transmissive universal dynamic elements including aperture element TE and mask element TM. Both elements TE and TM consist of an x, y matrix array of small pixels, which is preferably provided by a Spatial Light Modulator (SLM). Every pixel can be switched ON/OFF ("0"/"1") by the Central Processing Unit (CPU) of computer 26 to form a designed off axis aperture for element TE and a device pattern for element TM from a computer data base stored on data storage device 30 such as a disk drive or other Direct Access Storage Device (DASD). The computer 26 is connected by conventional interconnection block 34 to the transmissive element TE which comprises an array of actuator lines extending along rectilinear X and Y coordinate axes. Similarly, the computer 26 is also connected by line 36 to the conventional interconnection block 38 to the transmissive aperture element TE. The X lines X1 to Xm extend horizontally parallel to the X axis and the Y lines Y1 to Yn extend vertically parallel to the y axis, where "m" and "n" are positive integers equal to the number of parallel actuator lines in the array with m horizontal lines X1 ... Xm and n vertical lines Y1 ... Yn.

Figure 5A:
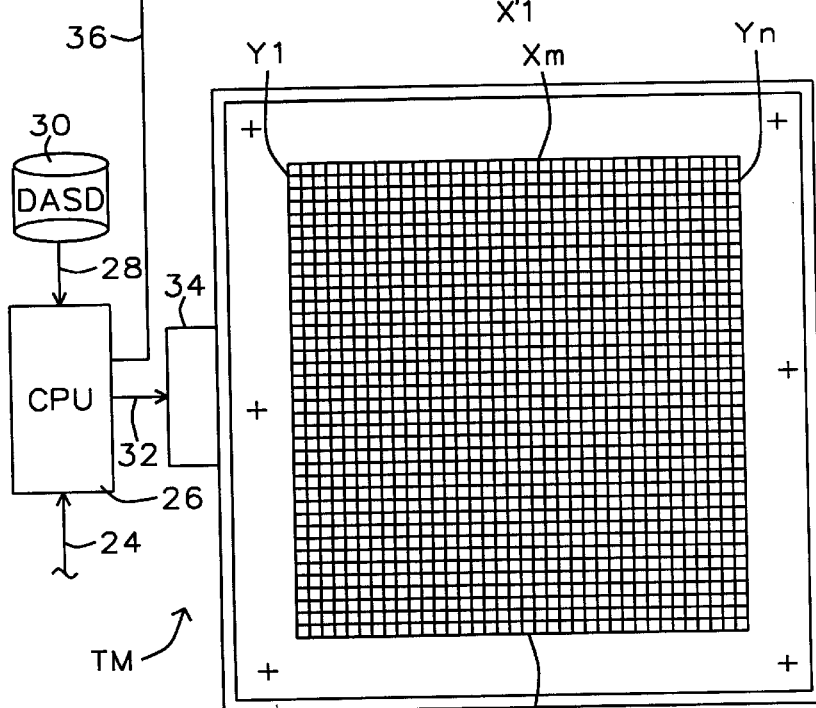
FIG. 5A is a schematic drawing showing plan views of both of the transmissive universal dynamic elements including aperture element TE and mask element TM.

FIG. 5B shows a key for the shading of the pattern of ON and OFF pixels in the transmissive aperture element TE which shows a large aperture pattern with transmissive region TR5 and opaque pixel regions OP.

Figure 6A:
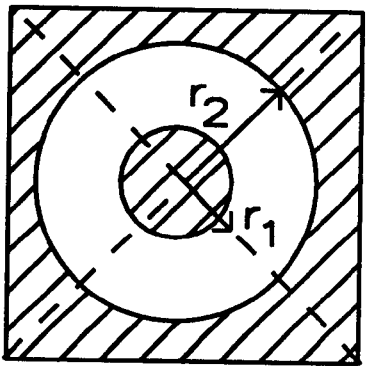
FIG. 6A shows a plan view of a transmissive aperture element with a large annular window with an inner radius r1 and an outer radius r2.

FIG. 6A shows a plan view of a transmissive aperture element with a large annular window with an inner radius r1 and an outer radius r2.

Figure 6B:
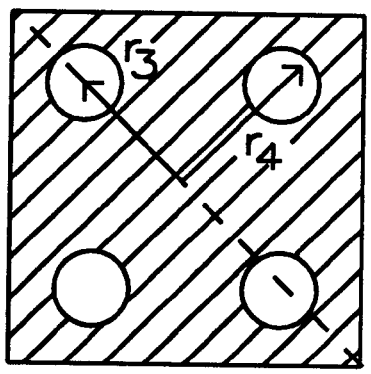
FIG. 6B shows a plan view of a transmissive aperture element with a set of quadrupoles located a radius r3 from the center, with each of the apertures having a radius r4.

FIG. 6B shows a plan view of a transmissive aperture element with a set of quadrupoles located a radius r3 from the center, with each of the apertures having a radius r4.

Figure 6C:
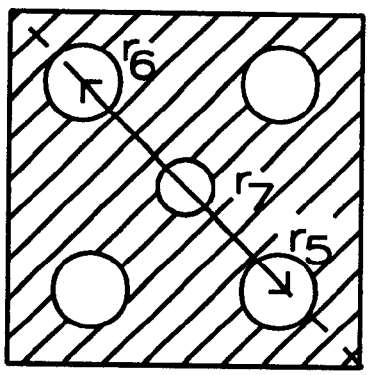
FIG. 6C shows a plan view of a transmissive aperture element with a set of quadrupoles located a radius r5 from the center, with each of the apertures having a radius r6 and with a center aperture having a radius of r7.

FIG. 6C shows a plan view of a transmissive aperture element with a set of quadrupoles located a radius r5 from the center, with each of the apertures having a radius r6 and with a center aperture having a radius of r7.

The computer 26 can vary the value of the radii r1, r2, r3, r4, r5, r6, r7 ... ri where i is a positive integer to control the annularity of the OAI blades seen in FIGS. 6A–6B by varying the annular light radius and width and varying the spacing and diameter of the various quadrupole arrangements.

By characterizing the wafer side pattern quality (contrast, DOF, resolution, for a fixed mask, one can optimize an OAI blade pattern for various types of layouts (dense line/space, iso-line, contact hole or island pattern ... )

For different masks, by electronically choosing an appropriate pattern for each mask, using the universal transmissive aperture element TE, one can optimize the image, DOF and resolution.

Figure 7A:
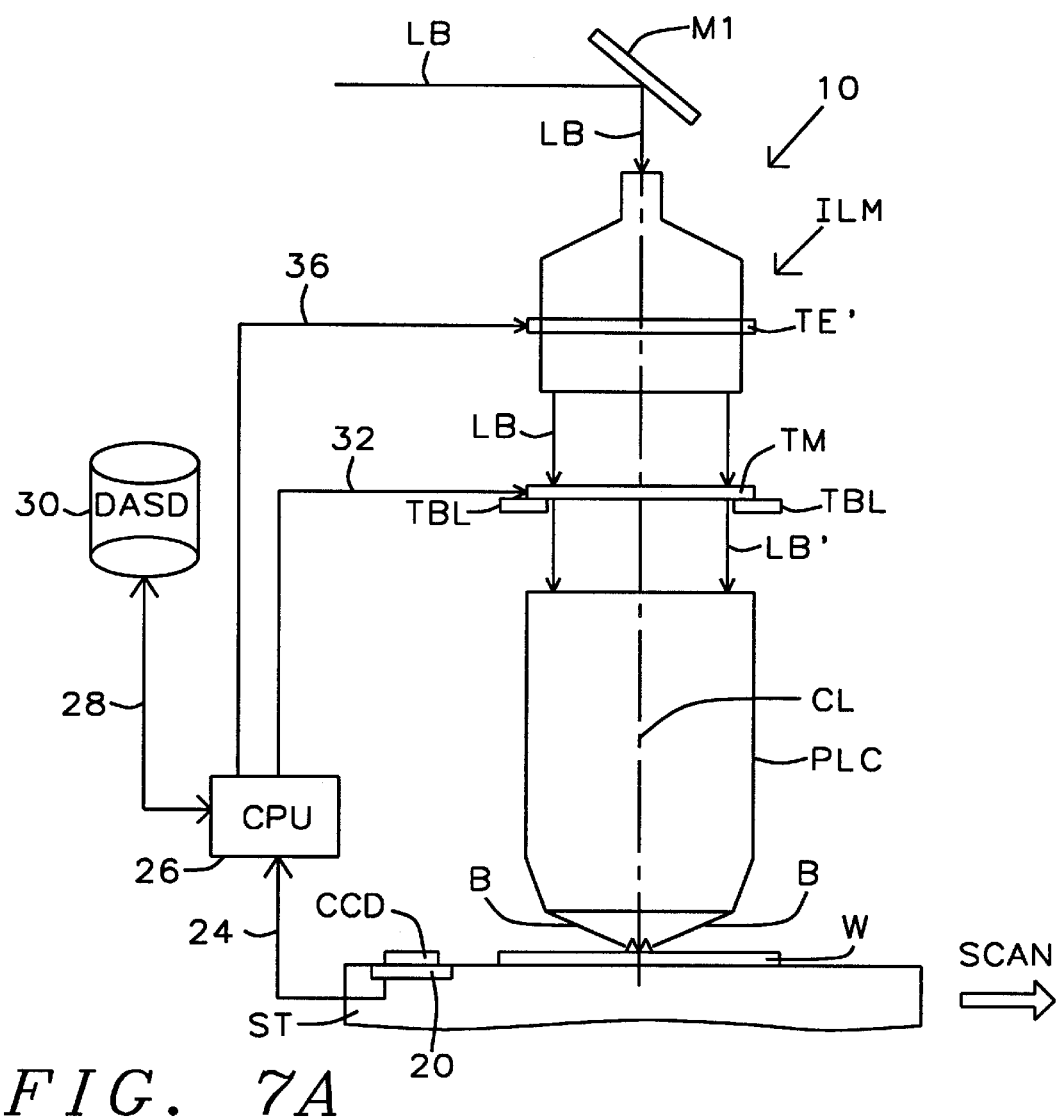
FIG. 7A shows a schematic elevational partially sectional view of a stepper exposure system taken along the x (horizontal from left to right) and z (vertical) axes (in an x, y, z coordinate system) in accordance with this invention.

FIG. 7A shows a stepper tool 10 in a schematic elevational partially sectional view of an exposure system taken along the x (horizontal from left to right) and z (vertical) axes (in an x, y, z coordinate system) in accordance with this invention. The tool 10 exposes a workpiece W with a pattern of light projected through a transmissive universal dynamic mask TM in accordance with this invention. A transmissive universal dynamic aperture element TE is supported in a fixed position in the illumination column ILC. A transmissive universal dynamic mask TM is supported in a fixed position on table TBL. The system 10 exposes a workpiece W supported by a stage ST with light projected through openings in the aperture element TE and the mask TM. The aperture element TE and the mask TM are energized to provide transmissive patterns selected through x, y matrices as illustrated by FIG. 5A which shows plan views of the transmissive elements TE and TM and the control system including computer 26 which energizes the pixel elements of the aperture element TE and the mask TM. Thus workpiece W is exposed to light which passes through element TE with a pattern provided by mask TM under control of computer 26.

In FIG. 7A in a stepper exposure tool 10, a beam LB from a light source (not shown) is directed at a mirror M1 which reflects the beam LB from a light source down along a path parallel to the vertical z axis into an illuminator lens module ILM which includes a condenser lens which passes the light of beam LB into an illumination lens column ILC in module ILM. Illumination lens column ILC comprises a set of lenses, and the transmissive aperture element TE'. The illumination module ILM produces a collimated beam (i.e. parallel beam) of light rays directed towards mask TM through which a portion LB' of the beam LB passes in accordance with the pattern of the mask TM. The beam LB floods the upper surface of the mask TM which is supported in a fixed position on table TBL. Table TBL has a hollow opening below the central patterning portion of mask TM through which the beam LB' passes.

The workpiece W preferably comprises a silicon semiconductor wafer coated with a photoresist layer which is to be exposed to a pattern comprising the image projected through mask TM. That pattern is projected as a collimated beam LB through the currently transparent portions of the mask TM. Thus, portions of the collimated beam LB pass through the mask TM, where the mask TM is transmissive, (not where it is opaque) thereby projecting an image defined by mask TM and patterned in light beam LB' onto workpiece W.

Transmissive universal dynamic mask TM preferably comprises a transmissive Spatial Light Modulator (SLM) with an array of pixels each of which is opaque or transparent respectively in accordance with the x, y matrix binary signals provided from CPU 26 on line 32 to the mask TM. The CPU 26 controls every pixel to be "ON" or "OFF".

Every pixel of the matrix of mask TM is switched ON (light: "1") or OFF (dark: "0") in response to signals on x and y matrix lines. The binary ON/OFF ("1"/"0") signals provide transmissive or opaque regions in the matrix through which beam LB is projected using a transmissive universal dynamic mask TM formed for example by a Spatial Light Modulator (SLM).

A circuit layout made by a designer and stored in disk drive storage device 20 is transferred from computer (CPU) 26 into the control lines 34 of the transmissive universal dynamic mask TM by appropriately turning the pixels "ON" and/or "OFF" in the appropriate locations to form each pattern desired as a function of time as different workpieces are loaded on the stage ST.

As stated above, patterning images provided by the transmissive mask TM are generated under control of a computer CPU 26 which energizes elements of the transmissive universal dynamic mask TM. Computer CPU 26 receives x, y matrix patterning data on line 28 from direct access storage device (DASD) 30, such as a disk drive, where the pattern data is stored. The CPU 26 also sends data on line 28 for storage in DASD 30, as is well understood by those skilled in the art.

After the light beam LB is projected through mask TM where it is converted into beam LB', beam LB' passes through projection lens column PLC to expose workpiece W projecting the patterning images received in the beam B from the transmissive mask TM onto the work W.

In other words the patterning images comprise portions of beam LB which pass through the mask TM as beam LB' and which then pass down through the projection lens column PLC which receives the beam LB' after it passes through the mask TM. The projection lens column PLC comprises a set of projection lenses focus the beam LB' into a beam B which exposes the surface of the workpiece W with the pattern projected from the mask TM above to expose the photoresist upon the surface of the workpiece W with the pattern projected from the mask TM.

Figure 7B:
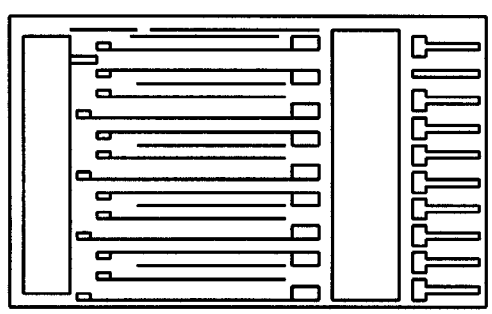
FIG. 7B shows a plan view of a pattern provided to the transmissive universal dynamic mask TM in FIG. 7A in response to signals provided by a computer from data in a DASD.

FIG. 7B shows a plan view of a pattern provided to the transmissive universal dynamic mask TM in FIG. 7A in response to signals provided by computer 26 from data in DASD 30, as will be explained in more detail below.

A CCD imager on wafer stage responds to the exposed pattern transferred from the mask/projection lens. The charge coupled device CCD produces an image which is transmitted into the CPU 26 (computer) and compared to the designed pattern in the data base stored in the data storage device 30. These CCD image results are analyzed to optimize and modify the pattern on mask TM. The CCD imager also assists the optimizations of focus, dose, Numerical Aperture and partial coherence setting.

Figure 7C:
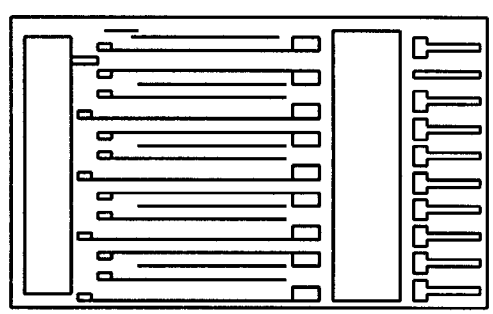
FIG. 7C shows a pattern is provided by the CCD in response to the image detected from the beam projected on the CCD with the patterns provided thereto by transmissive universal dynamic transmissive element.

FIG. 7C shows a pattern is provided by the CCD 20 in response to the image detected from the beam B projected on CCD 20 with the patterns provided thereto by transmissive universal dynamic transmissive element TM. The CCD 20 provides feedback data to computer 26 as will be explained in more detail below. Ideally, the view seen in FIG. 7B should be identical to the view seen in FIG. 7C but a difference is very likely to occur since the view seen in FIG. 7B is the original image and the view seen in FIG. 7C is the actual image which will differ based upon any deviation of the optical system from the illumination system including the aperture element TE and the projection system ILC in projection of a perfect image. Any effect on the pattern provided to transmissive aperture element TE in FIG. 7A in response to signals provided by computer 26 from data in DASD 30 will be reflected in the image seen in FIG. 7C.

Figure 8:
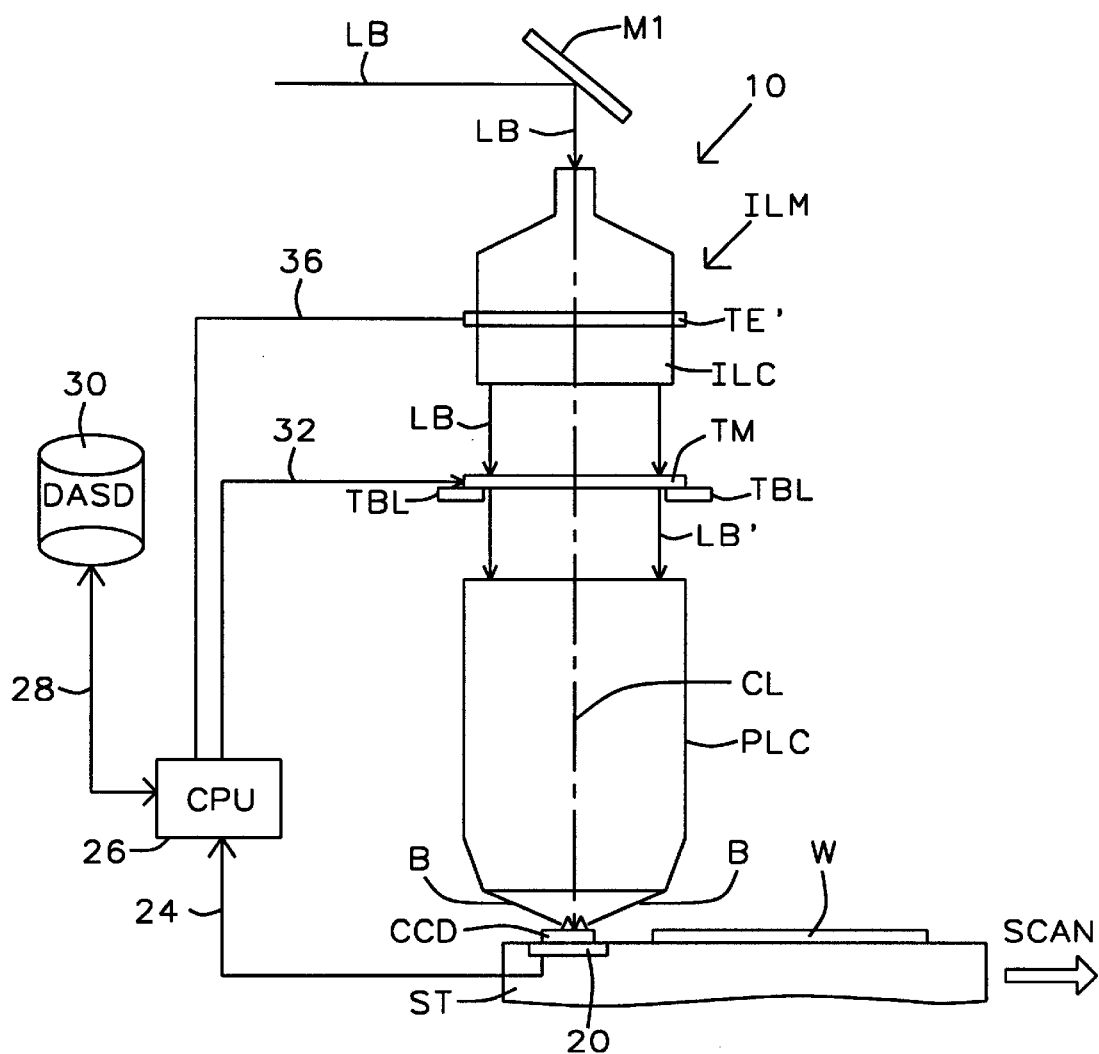
FIG. 8 is the stepper exposure system of FIG. 7A with the support table moved to the right to show how performance of the system is monitored by use of feedback from a CCD image sensor which supplies the detected image data from the beam to the CPU to use the data read for correction of the deviation of the image in FIG. 7C to match the image seen in FIG. 7B.

On the other hand, the view seen in FIG. 7C is the pattern detected by the CCD device 20 when the beam B is hitting the CCD device 20 as shown in FIG. 8 where the stage has moved far to the right side of the tool 10 providing the ideal identical pattern shown in FIG. 7C.

When a different layer is exposed, it is not necessary to reload the mask TM mechanically, only load the device/layer file through the CPU to the mask TM.

The whole device uses the same physical mask TM (fixed pixel) and there is no mechanical movement of the mask TM, which will improve the overlay (layer to layer) dramatically.

This significantly reduces the mask set required.

| DATA BASE | |
|---|---|
| Device A | Device B |
| Layer 1 | Layer 1 |
| Layer 2 | Layer 2 |
| Layer 3 | Layer 3 |
| Layer 4 | Layer 4 |

1. A CCD image (aerial image) is compared to real processed wafer CD to calibrate the CCD image Critical Dimension (CD), to fix the threshold of the aerial image as shown in FIG. 3 which shows a graph for the CCD aerial image of Intensity as a function of distance x in micrometers.
2. Then the CCD image of the CD will also be compared to the data-Base patterns to determine the CD variations and distortion on the CCD image.
3. Then the system in computer 26 corrects the CD and distortion on the dynamic mask TM.
4. Using this CCD image, one can set criteria to determine an optimum focus of the lens module and optimum stage levelling of the exposure tool ET of FIG. 7A.
5. One can also change the focus and exposure dose, then check the CCD image/data-Base pattern mapping result, followed by feeding back to the CPU to determine the best NA (Numerical Aperture) and partial coherence of lens parameters to give the best setting for obtaining the largest depth of focus and energy latitude.

FIG. 8 is the system of FIG. 7A with the support table ST moved to the right to show how performance of the tool 10 is monitored by use of feedback from a charge coupled device (CCD) image sensor 20 which supplies the detected image data from the beam B to the CPU 26 to use the data read for correction of the deviation of the image in FIG. 7C to match the image seen in FIG. 7B.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An off axis illumination system in a stepper tool includes an aperture element, a lens, and a mask wherein said aperture element comprises a transmissive spatial light modulator in the form of an array of electronically switchable pixels in a matrix providing off-axis light-transmitting regions patterned for enhanced critical dimension control.

2. An off axis illumination system in a stepper tool including:
   a lens,
   a mask, and
   an aperture element comprising an array of electronically switchable pixels in a matrix and said aperture element comprising a spatial light modulator with an annular pattern of transmissivity.

3. A system in accordance with claim 1 wherein said aperture element comprises a transmissive spatial light modulator with an annular pattern of transmissivity.

4. A system in accordance with claim 1 wherein said aperture element comprises a transmissive spatial light modulator operated under computer control.

5. A system in accordance with claim 1 wherein said aperture element comprises a transmissive spatial light modulator with a pattern of transmissivity operated under computer control.

6. A system in accordance with claim 1 wherein said aperture element comprises a spatial light modulator with a pattern of transmissivity operated under computer control to provide variable dimensions of said pattern with dimensions selected by said computer to optimize operation of said spatial light modulator in a stepper tool.

7. A system in accordance with claim 1 wherein said aperture element comprises a first transmissive spatial light modulator with a pattern of transmissivity operated under computer control, and a mask comprising a second transmissive spatial light modulator operated under computer control operating cooperatively to provide an image upon a workpiece being exposed in a stepper tool by said mask.

8. A method of operating an off axis illumination system in a stepper tool including the steps as follows:
   provide illumination light,
   provide a lens,
   provide a mask,
   provide an aperture element comprising a transmissive spatial light modulator including electronically switchable pixels in a pixel matrix providing off-axis light-transmitting regions patterned for enhanced critical dimension control which permit selective transmission of light therethrough with patterns selected electronically,
   apply an element image to said pixel matrix, and
   project said illumination light for selective transmission through said lens, through said mask and through said transmissive spatial light modulator as a function of said selective transmission of said illumination light as a function of operation of said electronically switchable pixels.

9. A method in accordance with claim 8 wherein said aperture element comprises a transmissive spatial light modulator with an annular pattern of transmissivity.

10. A method in accordance with claim 8 wherein said aperture element comprises a transmissive spatial light modulator operated under computer control.

11. A method in accordance with claim 8 wherein said aperture element comprises a spatial light modulator with a pattern of transmissivity operated under computer control.

12. A method in accordance with claim 8 wherein said aperture element comprises a spatial light modulator with a pattern of transmissivity operated under computer control to provide variable dimensions of said pattern with dimensions selected by said computer to optimize operation of said spatial light modulator in a stepper tool.

13. An method in accordance with claim 8 wherein said aperture element comprises a first transmissive spatial light modulator with a pattern of transmissivity operated under computer control, and a mask comprising a second transmissive spatial light modulator operated under computer control operating cooperatively to provide an image upon a workpiece being exposed in a stepper tool by said mask.

* * * * *